United States Patent
Goldbach

(10) Patent No.: US 6,864,188 B2
(45) Date of Patent: Mar. 8, 2005

(54) SEMICONDUCTOR CONFIGURATION AND PROCESS FOR ETCHING A LAYER OF THE SEMICONDUCTOR CONFIGURATION USING A SILICON-CONTAINING ETCHING MASK

(75) Inventor: Matthias Goldbach, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/454,518

(22) Filed: Jun. 4, 2003

(65) Prior Publication Data
US 2003/0207588 A1 Nov. 6, 2003

Related U.S. Application Data

(63) Continuation of application No. PCT/DE02/00130, filed on Jan. 17, 2002.

(30) Foreign Application Priority Data

Jan. 26, 2001 (DE) .......................................... 101 03 524

(51) Int. Cl.$^7$ .......................................... H01L 21/302
(52) U.S. Cl. ...................... 438/753; 438/622; 438/672; 438/719
(58) Field of Search ................................. 438/753, 297, 438/758, 700, 719, 228, 426, 622, 672

(56) References Cited

U.S. PATENT DOCUMENTS

| | | | | |
|---|---|---|---|---|
| 3,510,369 A | | 5/1970 | Ernick et al. | |
| 4,091,169 A | * | 5/1978 | Bohg et al. | 428/428 |
| 4,172,005 A | * | 10/1979 | Muraoka et al. | 438/753 |
| 4,211,601 A | * | 7/1980 | Mogab | 438/719 |
| 4,283,249 A | * | 8/1981 | Ephrath | 216/66 |
| 4,514,251 A | | 4/1985 | Van Ommen et al. | |
| 4,782,009 A | | 11/1988 | Bolon et al. | |
| 4,885,054 A | * | 12/1989 | Shibagaki | 438/719 |
| 4,889,828 A | * | 12/1989 | Jeuch | 438/426 |
| 5,091,047 A | * | 2/1992 | Cleeves et al. | 438/704 |
| 5,217,568 A | * | 6/1993 | Tessier et al. | 216/99 |
| 5,240,554 A | | 8/1993 | Hori et al. | |
| 5,314,832 A | * | 5/1994 | Deleonibus | 438/297 |
| 5,350,484 A | * | 9/1994 | Gardner et al. | 438/669 |
| 5,397,431 A | | 3/1995 | Kadomura | |
| 5,401,359 A | | 3/1995 | Kadomura | |
| 5,525,535 A | * | 6/1996 | Hong | 438/228 |
| 5,676,752 A | * | 10/1997 | Bozler et al. | 117/89 |
| 6,025,117 A | * | 2/2000 | Nakano et al. | 430/314 |
| 6,025,273 A | | 2/2000 | Chen et al. | |
| 6,387,819 B1 | * | 5/2002 | Yu | 438/725 |
| 6,458,516 B1 | * | 10/2002 | Ye et al. | 430/317 |
| 6,503,788 B1 | * | 1/2003 | Yamamoto | 438/231 |
| 6,527,968 B1 | * | 3/2003 | Wang et al. | 216/67 |
| 6,566,276 B2 | * | 5/2003 | Maloney et al. | 438/758 |
| 6,583,046 B1 | * | 6/2003 | Okada et al. | 438/622 |

OTHER PUBLICATIONS

La Marche, P. H. et al.: "Amorphous Silicon as an Inorganic Resist", The International Society for Optical Engineering, vol. 471, 1984, one page.

Komeda, H. et al.: "Gas Chemistry Dependence of Si Surface Reactions in a Fluorocarbon Plasma during Contact Hole Etching", Japanese Journal of Applied Physics, vol. 37, Part 1, No. 3B, Mar. 1998, pp. 1198–1201.

* cited by examiner

Primary Examiner—Richard Elms
Assistant Examiner—Christian D. Wilson
(74) Attorney, Agent, or Firm—Laurence A. Greenberg; Werner H. Stemer; Ralph E. Locher

(57) ABSTRACT

To increase the etching resistance and to reduce the etching rate of a silicon-containing mask layer, an additional substance is mixed into the mask layer or into an etching gas. The additional substance is present in the mask layer or a concentration of the additional substance can be subsequently increased in the mask layer. During a subsequent etching process for patterning using the mask layer, the mask layer is removed at a reduced etching rate.

10 Claims, 1 Drawing Sheet

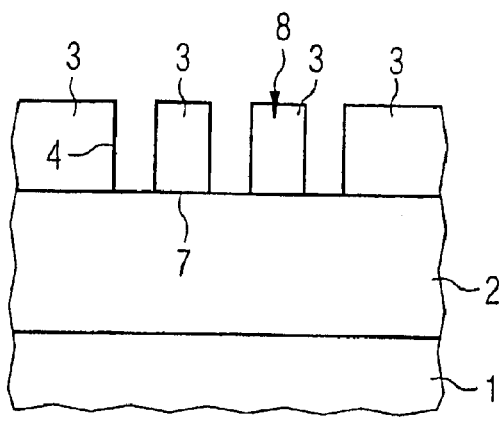
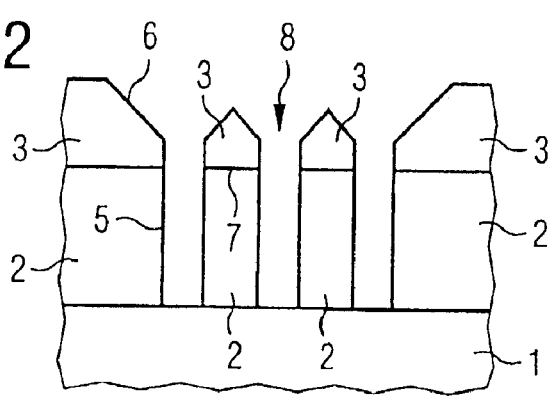
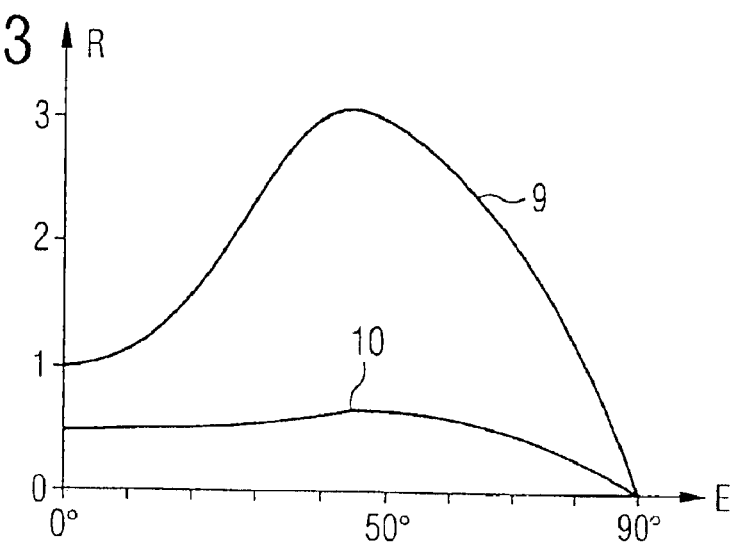

SEMICONDUCTOR CONFIGURATION AND PROCESS FOR ETCHING A LAYER OF THE SEMICONDUCTOR CONFIGURATION USING A SILICON-CONTAINING ETCHING MASK

CROSS-REFERENCE TO RELATED APPLICATION

This application is a continuation of copending International Application No. PCT/DE02/00130, filed Jan. 17, 2002, which designated the United States and was not published in English.

BACKGROUND OF THE INVENTION

Field of the Invention

The present invention relates to a semiconductor configuration and to a process for etching a layer of the semiconductor configuration using a silicon-containing etching mask.

Etching processes are customarily employed to pattern semiconductor substrates. For this purpose, an etching mask is applied to a layer that will be patterned and patterning is carried out using photolithography. Some regions of the layer that will be patterned are now covered and protected by the etching mask, whereas other regions of the layer that will be etched are uncovered. In a subsequent etching step, the layer that will be etched is etched away using an etchant. In the process, the regions of the layer being etched that are covered by the etching mask are protected from the etching substance, so that at these positions, there is no etching of the layer being etched. Since, during the etching operation, both the layer being etched and the etching mask are exposed to the etching substance, material is removed from both layers. It is customary to select an etching mask that has a high selectivity with respect to the layer that will be etched using the etchant. This means that the amount of material removed by etching from the etching mask is much lower than the amount of material removed from the layer being etched. Consequently, it is possible to etch deep structures into the layer being etched while using relatively thin etching masks. Typical materials that are used in silicon semiconductor technology are silicon, silicon oxide, and silicon nitride. Each of the three materials is suitable for use as an etching mask for one or both of the other materials when a suitable etching substance is employed.

By way of example, an etching mask made from silicon is suitable for etching silicon oxide and silicon nitride in combination with a fluorohydrocarbon-containing etching gas.

SUMMARY OF THE INVENTION

It is accordingly an object of the invention to provide a silicon-containing etching mask and a process for etching using the silicon-containing etching mask in which the etching rate of the silicon-containing etching mask is reduced.

With the foregoing and other objects in view there is provided, in accordance with the invention, a semiconductor configuration, including: a semiconductor substrate having a substrate surface; and a first layer configured on the substrate surface. The first layer includes silicon oxide or silicon nitride and has a surface. The semiconductor configuration also includes a silicon-containing mask layer configured on the surface of the first layer. The term "first" in the first layer is only used as a means of identification so that the first layer and the mask layer can be subsequently referenced without ambiguity. The term "first" in the first layer should not be construed as having any significance with regard to the position of the first layer on the substrate. There could be other layers between the first layer and the substrate. The mask layer has an etching resistance and serves as an etching mask for the first layer. The mask layer includes a substance resulting in an increase of the etching resistance of the mask layer. The substance forms a solid at a pressure between 1 and 500 mTorr and at a temperature between −20° C. and 200° C. The substance also forms a gaseous oxidized and/or nitrided molecule. The substance includes a sulphur-hydrogen compound or a carbon in a hydrocarbon chain.

The additional substance is used as an additive in the mask layer, with the result that the etching rate of the silicon-containing mask layer is reduced. This advantageously ensures that the etching resistance of the silicon-containing mask layer is increased by the additional substance. By way of example, a thinner mask layer can be used to etch deeper trenches into a layer that will be etched. This is advantageous since a thin mask layer can be patterned using photolithography with a higher resolution than a thick mask layer. Consequently, the feature size that can be transferred using the mask layer becomes smaller, which advantageously leads to smaller components, which take up less space, on the semiconductor substrate.

One configuration of the invention provides for the substance to form a fraction of up to 50% of the mask layer.

A further configuration of the invention provides for the substance to form a solid at a pressure of between 1 and 500 mTorr and a temperature of between −20° C. and 200° C. and to form a gaseous material as an oxidized and/or nitrided molecule. This has the advantage that, within the temperature range indicated, the substance can be integrated into the mask layer as a solid substance and can also be converted into a gaseous substance and can, therefore have a volatile form by using oxygen, so that the additional substance can be removed during the etching process.

If, by way of example, the silicon-containing etching mask is formed almost completely from silicon and the layer that will be etched is formed from silicon oxide, the silicon oxide is converted into silicon fluoride and oxygen by using a fluorohydrocarbon-containing etching gas. Compared to silicon oxide, the silicon-containing mask layer is attacked and converted to a much lesser extent by the etching substance. Furthermore, this is reduced by the additional substance. If the additional substance is now likewise arranged in the vicinity of or on the silicon oxide layer that will be etched, the additional substance is oxidized by the oxygen that is released from the silicon oxide layer and is converted into a volatile gaseous form. In this way, the etching selectivity between the silicon-containing etching mask and the silicon oxide layer being etched is increased.

The embodiment of the invention provides for the substance to contain carbon in the form of a hydrocarbon chain or sulphur in the form of hydrogen sulphide. Carbon and sulphur are advantageously suitable for reducing the rate at which silicon with added carbon or sulphur is removed when using a fluorohydrocarbon-containing etching gas.

A further configuration of the invention provides for the substance to contain aluminium, gallium, indium, thallium or boron in a concentration of more than $10^{19}$ atoms per cm$^3$ and to be electrically activated. Electrically activated means that boron is incorporated at lattice sites of the Si crystal lattice. The substances are p-dopants for the silicon-containing mask layer. A p-doped mask layer advantageously also has an increased etching resistance.

Furthermore, the layer that will be etched can contain silicon oxide or silicon nitride.

A further configuration of the invention provides for the substance to be implanted in the silicon-containing mask layer.

A further configuration of the invention provides for the substance to be incorporated in the silicon-containing mask layer by being supplied while the silicon-containing mask layer is being formed.

With the foregoing and other objects in view there is provided, in accordance with the invention, a process for etching a layer of a semiconductor configuration. The process includes steps of: forming a first layer including silicon oxide or silicon nitride on a substrate, the first layer having a surface; forming a mask layer on the surface of the first layer, the mask layer including silicon; patterning the mask layer for forming a mask pattern; and etching the first layer using a fluorohydrocarbon-containing etching gas containing hydrocarbon molecules and/or sulphur-hydrogen compounds while using the etching mask to partially protect the surface of the first layer against the etching gas.

The inventive process brings together carbon and/or sulphur and an etching gas in an etching installation, with the result that the rate at which the silicon-containing etching mask is etched is reduced.

One configuration of the process provides for the levels of the sulphur-hydrogen compounds including, for example, $SH_2$, and/or the hydrocarbon molecules including, for example, $CH_4$, contained in the etching gas to increase in or on the mask layer during the etching step. This increase in levels in or on the mask layer has the advantage of increasing the etching resistance of the silicon-containing etching mask and therefore of reducing the rate at which it is etched.

A further advantageous process step provides for the levels of the sulphur and/or carbon atoms contained in the etching gas to increase in or on the mask layer during the etching step. The increase in the levels of carbon and/or sulphur atoms likewise has the advantage of reducing the rate at which the silicon-containing mask layer is etched.

Other features which are considered as characteristic for the invention are set forth in the appended claims.

Although the invention is illustrated and described herein as embodied in a semiconductor configuration and process for etching a layer of the semiconductor configuration using a silicon-containing etching mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic cross sectional view of a substrate with a layer and a mask layer;

FIG. 2 is a diagrammatic cross sectional view of the configuration shown in FIG. 1, in which the layer has been patterned using the mask layer; and FIG. 3 is a graph showing a representation of the etching rate against the angle of incidence of the etching gas, with and without an additional substance.

DESCRIPTION OF THE PREFERRED EMBODIMENTS

Referring now to the figures of the drawing in detail and first, particularly, to FIG. 1 thereof, there is shown a substrate 1 on which there is a layer 2. The layer 2 has a surface 7 which is remote from the substrate 1. A mask layer 3 is arranged on the surface 7 of the layer 2. The mask layer 3 is designed in such a way that it has a mask pattern 4 formed as trenches in the mask layer 3. The substrate 1 consists, for example, of a silicon-containing material. The layer 2 contains silicon oxide and/or silicon nitride. The mask layer 3 contains silicon, and the silicon content may be up to 100%.

A first embodiment provides for the silicon-containing mask layer 3 to contain an additional substance 8. The additional substance is, for example, carbon and/or sulphur. The additional substance is, for example, deposited together with the mask layer 3 while the mask layer 3 is being formed, with the result that the substance 8 is incorporated in the mask layer 3. A further process variant for forming the mask layer 3 involves initially forming by the mask layer 3 without the additional substance 8. Then, the additional substance 8 is introduced into the mask layer 3, for example, by an implantation.

Examples of other suitable materials for the additional substance 8 are p-dopants, such as aluminium, gallium, indium, thallium and boron.

The layer 2 is then etched in accordance with the configuration illustrated in FIG. 2.

FIG. 2 shows the configuration illustrated in FIG. 1 at a later time. First of all, etching has been carried out using a fluorohydrocarbon-containing etching gas such that a trench 5 has been formed in the layer 2 and a facet 6 has been formed on the mask layer 3. The substance 8 first has the effect of reducing the rate at which material is removed from the mask layer 2 and, in particular, of reducing the rate at which material is removed at the facet angle being formed. The facet angle is in this case measured between the substrate surface and the facet 6.

A further exemplary embodiment in accordance with FIG. 1 includes initially forming the mask layer 3 without the additional substance 8. Then, with reference to FIG. 2, the additional substance 8 is admixed with the etching gas and, during the etching operation, leads to an increase in the etching selectivity, since the levels of the additional substance 8 in and/or on the mask layer 3 increase. As a result, the rate at which material is removed from the mask layer 3 is reduced. During the etching operation, the amount of the substance 8 in the mask layer 3 increases, with the result that the etching selectivity is increased further.

With regard to the present exemplary embodiment, there is provision, for example, for the layer 2 to have a thickness of 1000 nm and to be formed from silicon oxide and/or silicon nitride. The mask layer 3 may be formed, for example, from silicon with a thickness of 100 nm and additionally includes the substance 8.

The additional substance 8 first leads to a reduction in the rate at which material is removed from the mask layer 3 and, in particular, has the effect of reducing the rate at which material is removed on the facet angle being formed.

FIG. 3 is a diagram that, on the horizontal axis denoted by E, shows the angle of incidence E of the etching substance on the substrate in degrees (°). The etching rate—normalized to an angle of incidence of 0°—is plotted on the vertical axis, which is denoted by R. A first curve 9 represents, for example, the etching rate of an amorphous silicon layer. At an angle of incidence of 0°, the normalized etching rate is 1. The etching rate increases for angles between 40° and 45°, to a maximum of approximately 3, and then falls for larger angles, until an etching rate of 0 is reached at an angle of incidence of 90°. It follows from this that, given a vertical incidence of the etching substance on a patterned amorphous silicon layer, a particularly rapid etching rate is achieved in the direction of a 40° to 45° angle, resulting in a taper that forms the facet 6. The second curve 10 is likewise normalized to the etching rate of the first curve 9 at an angle of incidence of 0°. The additional substance 8 reduces the etching rate to a fraction of the etching rate without the additional substance. For larger angles, the etching rate rises to approximately 1.5 times this level at an angle of 55°. This means that the additional substance 8 leads to a significantly weaker taper effect, with the result that the facet 6 is formed with a steeper angle and a reduced etching rate.

I claim:

1. A semiconductor configuration, comprising:
    a semiconductor substrate having a substrate surface;
    a first layer configured on said substrate surface, said first layer including silicon oxide or silicon nitride and having a surface; and
    a silicon-containing mask layer configured on said surface of said first layer;
    said mask layer having an etching resistance and serving as an etching mask for said first layer;
    said mask layer including a substance resulting in an increase of said etching resistance of said mask layer; and
    said substance including a sulphur-hydrogen compound.

2. The semiconductor configuration according to claim 1, wherein said substance forms a fraction of up to 50% of said mask layer.

3. The semiconductor configuration according to claim 1, wherein said substance includes a concentration of more than $10^{19}$ atoms per $cm^3$ of one of aluminium, gallium, indium, thallium.

4. The semiconductor configuration according to claim 1, wherein said substance is implanted in said mask layer.

5. The semiconductor configuration according to claim 1, wherein said substance is introduced into said mask layer by being supplied while said mask layer is being formed.

6. A process for etching a layer of a semiconductor configuration, the process which comprises:
    forming a first layer including silicon oxide or silicon nitride on a substrate, the first layer having a surface;
    forming a mask layer on the surface of the first layer, the mask layer including silicon;
    patterning the mask layer for forming a mask pattern; and
    etching the first layer using an etching gas containing sulphur-hydrogen compounds while using the etching mask to partially protect the surface of the first layer against the etching gas.

7. The process according to claim 6, wherein during the etching step, sulphur-hydrogen compounds are increased in or on the mask layer.

8. The process according to one of claim 6, wherein during the etching step, levels of sulphur atoms are increased in or on the mask layer.

9. A semiconductor configuration, comprising:
    a semiconductor substrate having a substrate surface;
    a first layer configured on said substrate surface, said first layer including silicon oxide or silicon nitride and having a surface; and
    a silicon-containing mask layer configured on said surface of said first layer;
    said mask layer having an etching resistance and serving as an etching mask for said first layer;
    said mask layer including a substance resulting in an increase of said etching resistance of said mask layer; and
    said substance including an implanted hydrocarbon chain.

10. A semiconductor configuration, comprising:
    a semiconductor substrate having a substrate surface;
    a first layer configured on said substrate surface, said first layer including silicon oxide or silicon nitride and having a surface; and
    a silicon-containing mask layer configured on said surface of said first layer;
    said mask layer having an etching resistance and serving as an etching mask for said first layer;
    said mask layer including a substance resulting in an increase of said etching resistance of said mask layer; and
    said substance including a concentration of more than $10^{19}$ atoms per $cm^3$ of one of aluminium, gallium, indium, and thallium.

* * * * *